United States Patent
Pasadyn et al.

(10) Patent No.: US 6,665,623 B1
(45) Date of Patent: Dec. 16, 2003

(54) METHOD AND APPARATUS FOR OPTIMIZING DOWNSTREAM UNIFORMITY

(75) Inventors: Alexander J. Pasadyn, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/209,789

(22) Filed: Jul. 31, 2002

(51) Int. Cl.⁷ .................. G01R 31/26; G01R 31/265
(52) U.S. Cl. .................. 702/84; 324/765; 438/14
(58) Field of Search .................. 324/754, 765, 324/759; 438/5, 14; 700/108; 714/724; 702/81, 84, 182, 183

(56) References Cited

U.S. PATENT DOCUMENTS 5,917,332 A * 6/1999 Chen et al. .................. 324/765
6,368,884 B1 * 4/2002 Goodwin et al. .................. 438/14

* cited by examiner

Primary Examiner—John Barlow
Assistant Examiner—John Le
(74) Attorney, Agent, or Firm—Williams, Morgan & Amerson, P.C.

(57) ABSTRACT

A method includes measuring a characteristic of a workpiece at a plurality of locations. A uniformity profile is generated based on the characteristic measurements. At least one acceptable region of the workpiece is identified based on the uniformity profile. At least one unacceptable region of the workpiece is identified based on the uniformity profile. The uniformity profile is filtered to remove at least a portion of the characteristic measurements associated with the second unacceptable region. At least one parameter of an operating recipe for performing a process on the workpiece is determined based on the filtered uniformity profile.

17 Claims, 4 Drawing Sheets

METHOD AND APPARATUS FOR OPTIMIZING DOWNSTREAM UNIFORMITY

BACKGROUND OF THE INVENTION

1. Field of the Invention

This invention relates generally to the field of semiconductor device manufacturing and, more particularly, to a method and apparatus for optimizing downstream uniformity.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of process tools, including photolithography steppers, etch tools, deposition tools, polishing tools, rapid thermal process tools, implantation tools, etc. The technologies underlying semiconductor process tools have attracted increased attention over the last several years, resulting in substantial refinements. However, despite the advances made in this area, many of the process tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various process tools. The manufacturing tools communicate with a manufacturing framework or a network of processing modules. Each manufacturing tool is generally connected to an equipment interface. The equipment interface is connected to a machine interface that facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device. Various tools in the processing line are controlled in accordance with performance models to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

Target values for the various processes performed are generally based on design values for the devices being fabricated. For example, a particular process layer may have a target thickness. Operating recipes for deposition tools and/or polishing tools may be automatically controlled to reduce variation about the target thickness. In another example, the critical dimensions of a transistor gate electrode may have an associated target value. The operating recipes of photolithography tools and/or etch tools may be automatically controlled to achieve the target critical dimensions.

Typically, a control model is used to generate control actions for changing the operating recipe settings for a process tool being controlled based on feedback or feedforward metrology data collected related to the processing by the process tool. For some tools, the operating recipe parameters determined by the control model depend on a measure of uniformity on the wafer being processed. Various types of uniformity may be considered, such as feature critical dimension uniformity (e.g., line width, trench depth), process layer thickness uniformity, extent of sacrificial film removal (e.g., etch stop layer). Uniformity may vary in different ways across the wafer. For example, the uniformity may vary based on radial position or X-Y position (e.g., left-to-right). The control model may factor in the measured non-uniformity to attempt to reduce the variation after the next process has been performed. For example, a polishing tool may have separately controllable polishing zones that result in the polishing rate differing at different radial positions. This polishing variation may be used to polish a thicker portion of a process layer at a higher rate than a thinner portion, thus equalizing the process layer thickness after the polishing has completed. In another example, the parameters of an etch tool, such as plasma power, may be adjusted to compensate for variations in uniformity. Typically, adjusting the plasma power may affect whether the etch tool etches at a higher or lower rate in the center of the wafer as compared to the periphery.

In some cases, the non-uniformity present on the wafer may be of a high magnitude. For example, one region of the wafer (e.g., center) may have a characteristic that varies slightly from a target value, while another region (e.g., periphery) may have a characteristic that varies a greater amount. Attempting to process the wafer to compensate for the non-uniformity in the periphery region may actually deleteriously affect the center region, reducing the quality of the devices formed therein. For example, aggressive polishing in the periphery region may result in overpolishing in the center region that could cause dishing or erosion of features formed therein.

The present invention is directed to overcoming, or at least reducing the effects of, one or more of the problems set forth above.

SUMMARY OF THE INVENTION

One aspect of the present invention is seen in a method that includes measuring a characteristic of a workpiece at a plurality of locations. A uniformity profile is generated based on the characteristic measurements. At least one acceptable region of the workpiece is identified based on the uniformity profile. At least one unacceptable region of the workpiece is identified based on the uniformity profile. The uniformity profile is filtered to remove at least a portion of the characteristic measurements associated with the second unacceptable region. At least one parameter of an operating recipe for performing a process on the workpiece is determined based on the filtered uniformity profile.

Another aspect of the present invention is seen in manufacturing system including a metrology tool, a uniformity monitor, and a process controller. The metrology tool is configured to measure a characteristic of a workpiece at a plurality of locations. The uniformity monitor is configured to generate a uniformity profile based on the characteristic measurements, identify at least one acceptable region of the workpiece based on the uniformity profile, identify at least one unacceptable region of the workpiece based on the uniformity profile, and filter the uniformity profile to remove at least a portion of the characteristic measurements associated with the second unacceptable region. The process controller is configured to determine at least one parameter of an operating recipe for performing a process on the workpiece based on the filtered uniformity profile.

BRIEF DESCRIPTION OF THE DRAWINGS

The invention may be understood by reference to the following description taken in conjunction with the accompanying drawings, in which like reference numerals identify like elements, and in which.

Figure 1:
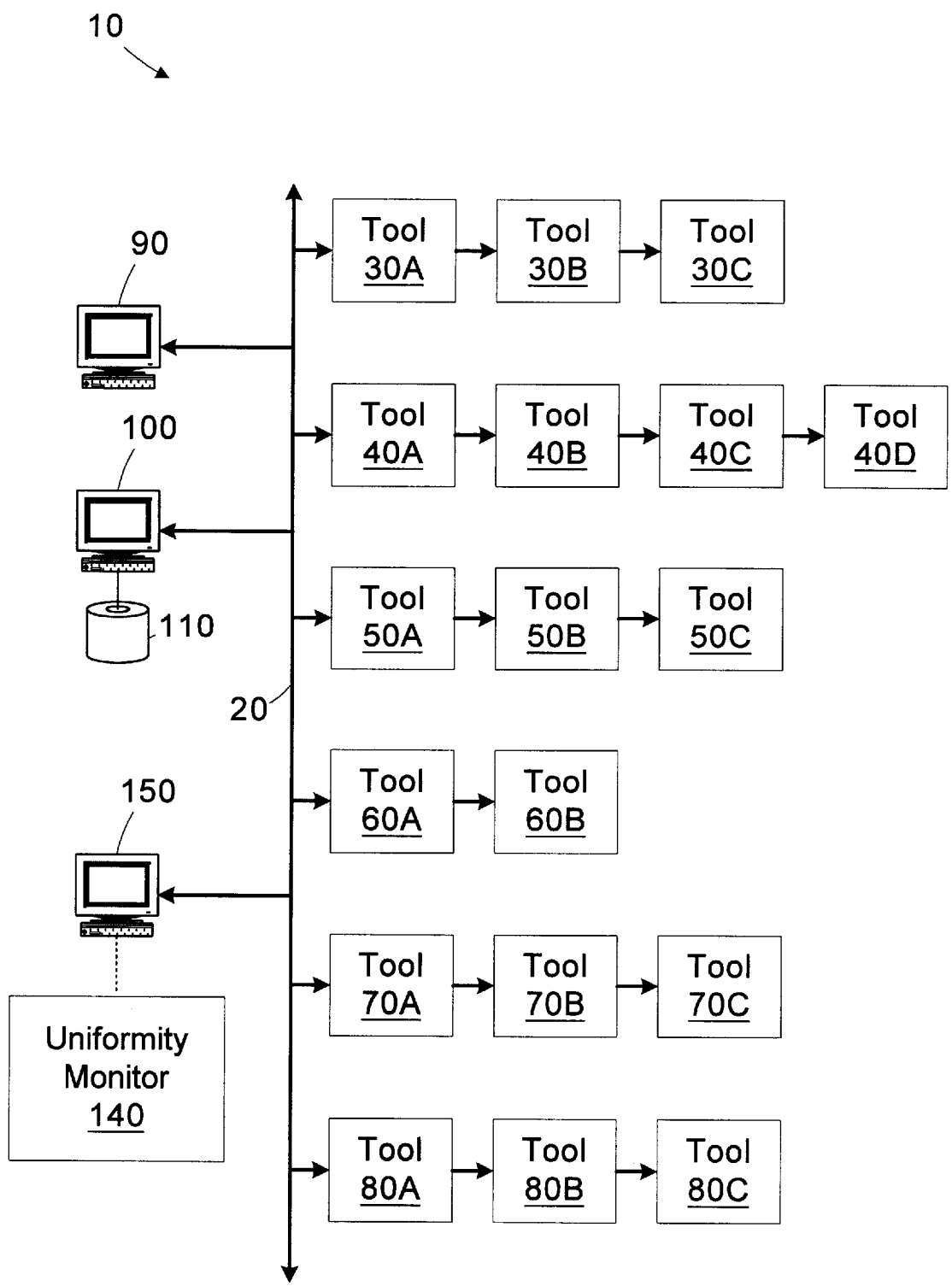
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other similar devices. The techniques may also be applied to workpieces or manufactured items other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization (CMP) tool. A particular wafer or lot of wafers progresses through the tools 30–80 as it is being manufactured, with each tool 30–80 performing a specific function in the process flow. Exemplary tools for a semiconductor device fabrication environment include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools may be arranged in any physical order or grouping. Additionally, the connections between the tools in a particular grouping are meant to represent only connections to the network 20, rather than interconnections between the tools.

A manufacturing execution system (MES) server 90 directs high level operation of the manufacturing system 10. The MES server 90 monitors the status of the various entities in the manufacturing system 10 (i.e., lots, tools 30–80) and controls the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, etc.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result.

The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

The processing and data storage functions are distributed amongst the different computers or workstations in FIG. 1 to provide general independence and central information storage. Of course, different numbers of computers and different arrangements may be used without departing from the spirit and scope of the instant invention.

The manufacturing system 10 also includes a uniformity monitor 140 executing on a workstation 150. As described in greater detail below, the uniformity monitor 140 receives data relating to the uniformity of wafers to be processed and uses the information to affect processing performed by the tools 30–80. Although the MES server 90 and uniformity monitor 140 are shown as separate entities, they may be integrated into a single unit. Similarly, the functions of the uniformity monitor 140 described herein may be integrated into a variety of other entities in the manufacturing system 10.

Figure 2:
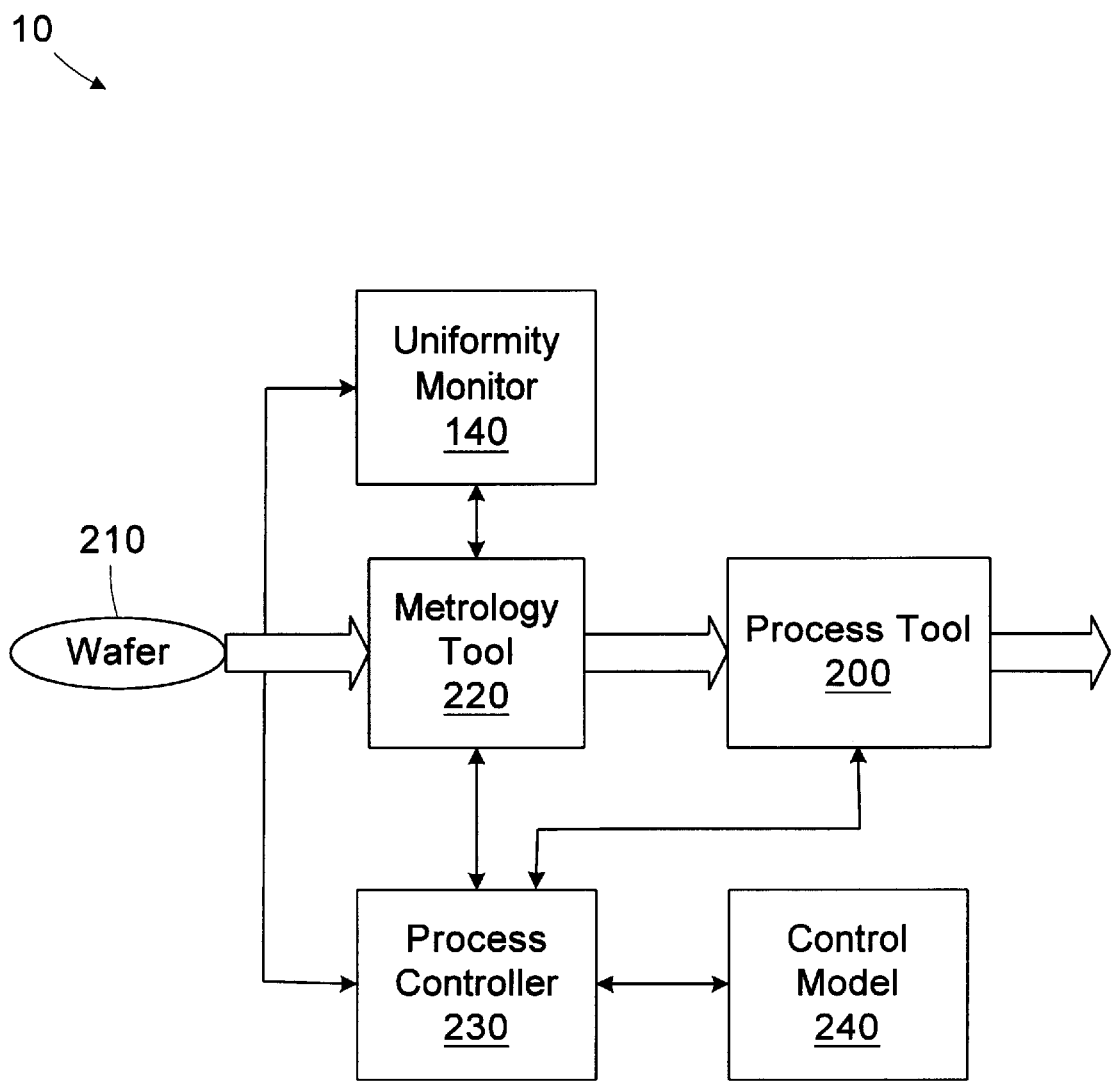
FIG. 2 is a simplified block diagram of a portion of the manufacturing system of FIG. 1.

Referring now to FIG. 2, a simplified block diagram of a portion of the manufacturing system 10 of FIG. 1 is provided. A process tool 200 (e.g., one of the tools 30–80) processes wafers 210 according to one of a plurality of operating recipes. The process tool 200 may also be a single chamber of a multiple chamber tool 30–80. A metrology tool 220 (e.g., one of the tools 30–80) measures uniformity characteristics of the wafers 210 to be processed in the process tool 200 and provides the uniformity data to the uniformity monitor 140. The uniformity data processed by the uniformity monitor 140 may be passed to a process controller 230 for dynamically updating the operating recipe of the process tool 200 to reduce non-uniformity in the variation between a characteristic of the wafer (i.e., post-process) and a target value for the characteristic. The process controller 230 thus adjusts the operating recipe parameters of the process tool 200 to account for its current state and the incoming state of the wafer 210 being processed.

The process controller 230 may use a control model 240 of the tool 200 to generate its prediction. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected. Using the control model, the process controller 80 may determine operating recipe parameters such as etch time, plasma power, temperature, pressure, reactant gas concentrations, etc. to reduce post-etch thickness variations. Other control scenarios are possible with other types of processing tools 30. In a plasma etch tool reducing plasma power in an etch process increases the rate of etch in the center relative to that at the edge. The specific relationship between power and etch rate is dependent on factors such as the particular etch tool and the recipe being used. The relationship for a particular configuration may be determined empirically and the control model 240 may be derived.

Figure 3:
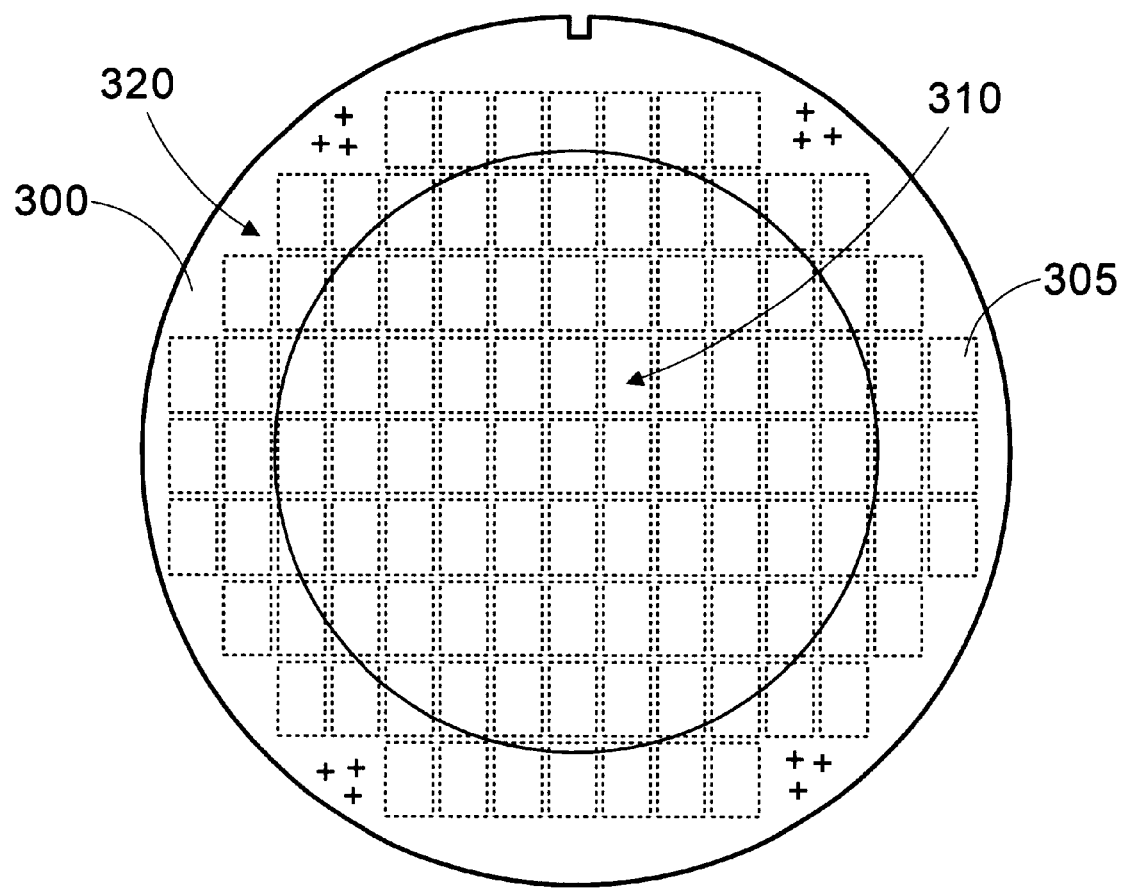
FIG. 3 is a simplified diagram of a wafer to be processed in the portion of the manufacturing system of FIG. 2.

The uniformity monitor 140 analyzes the uniformity data collected by the metrology tool 220 to generate a uniformity profile and determine if the uniformity data should be filtered prior to sending it to the process controller 230 for generation of a control action for updating the operating recipe of the process tool 200. Turning now to FIG. 3, a simplified diagram of a wafer 300 to be processed in the process tool 200 is provided. A plurality of die 305 (i.e., semiconductor devices) are defined on the wafer 300. The metrology tool 220 measures characteristics of the wafer 300 at various points to determine the uniformity profile of the wafer based on the characteristic measurements conducted across the wafer. For example, the metrology tool 220 may measure a process layer thickness at various points to determine if the process layer exhibits a dished (i.e., center thinner than periphery) or a domed (i.e., center thicker than periphery profile). In another example, the metrology tool 220 may measure a critical dimension of a feature (e.g., line width) formed on the wafer.

The uniformity monitor 140, based on the measured uniformity data, determines a first region 310 on the wafer 300 having an acceptable level of non-uniformity and a second region 320 where the non-uniformity is not acceptable. For example, a maximum range in the variation of the characteristic from a target for the characteristic may be acceptable. The boundary between the acceptable region 310 and the unacceptable region 320 occurs where the variation from the target exceeds a predetermined threshold. Although the regions 310, 320 are defined using a radial profile, other profiles, such as left-to-right, may be used, depending on the nature of the characteristic being measured and the previous processing performed that gave rise to the non-uniformity.

In another embodiment, the uniformity monitor 140 correlates the uniformity data with a performance metric associated with devices formed in the various regions. For example, the characteristics measured by the metrology tool 220 may be correlated to yield, reliability, speed, etc. In such an implementation, the boundary between the acceptable region 310 and the unacceptable region 320 occurs where the associated performance metric drops below a predetermined threshold. For example, if the predicted yield for a region is less than a threshold, it is unlikely that future processing steps will be able to recover in such a manner as to increase the yield. This region is thus included in the unacceptable region 320.

Many different measurements, both physical and electrical, may be used by the uniformity monitor 140 for determining performance metrics. An exemplary, but not exhaustive, list of physical measurements includes a transistor gate critical dimension, a process layer thickness, a particle contamination count, and a transistor active region dimension. An exemplary, but not exhaustive, list of electrical measurements includes a transistor effective channel length, a drive current, an insulating layer dielectric constant, a transistor overlap capacitance, a regional material resistivity, a transistor threshold voltage, an n-channel to p-channel drive current ratio, an off-state transistor leakage current, and electrical charge carrier mobility measurement, and an oscillator test circuit frequency.

In a case where the uniformity monitor 140 identifies an unacceptable level of non-uniformity, (e.g., based on applying a characteristic threshold or a performance metric threshold to the uniformity profile) it filters the uniformity data passed to the process controller 230 to remove data associated with the unacceptable region 320. Allowing the process controller 230 to ignore data from the unacceptable region allows the operating recipe to be tailored to preserve or enhance the performance metrics of the devices formed in the acceptable region 310. If the uniformity data were not filtered by the uniformity monitor 140, the performance metrics of the devices in the acceptable region 310 may be degraded because the processing is attempting to correct for the deviations in the unacceptable region 320. Filtering, on the other hand, ignores regions 320 where the devices may have been defective regardless of the subsequent processing, and preserves the value of the devices in the acceptable region 310.

In a first example where the process tool 200 is an etch tool, the characteristic measured by the metrology tool 200 may be the thickness of a process layer formed on the wafer 210. The operating recipe parameter determined by the process controller 230 may be a plasma power parameter (i.e., which affects the etch rate at different radial positions on the wafer 210). In another example, where the process tool 200 is a polishing tool, the characteristic measured by the metrology tool 200 may be the thickness of a process layer formed on the wafer 210. The operating recipe parameter determined by the process controller 230 may be a radial polishing pressure parameter (i.e., which affects the polish rate at different radial positions on the wafer 210). An exemplary technique for controlling a polishing tool having such radial control zones is described in U.S. patent application Ser. No. 09/837,606, entitled "METHOD AND APPARATUS FOR POST-POLISH THICKNESS AND UNIFORMITY CONTROL," filed in the names of Alexander J. Pasadyn, Christopher H. Raeder, and Anthony J. Toprac, and incorporated herein by reference in its entirety.

Although the uniformity monitor 140 and the process controller 230 are illustrated a separate entities, it is contemplated that they may be combined into a single unit, whereby the process controller 230 would account for the non-uniformity of the wafer 210 prior to determining a control action.

Figure 4:
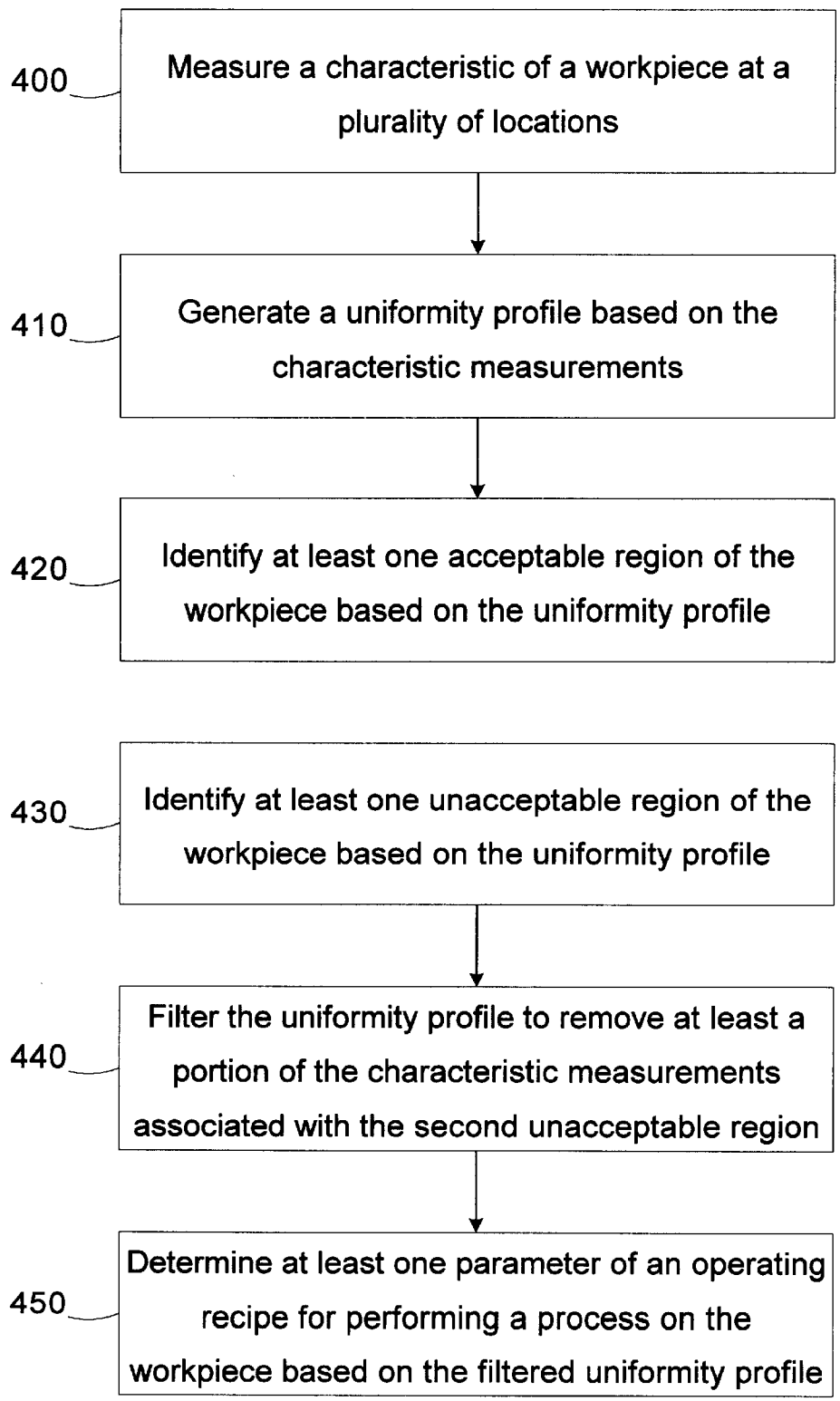
FIG. 4 is a simplified flow diagram of a method for controlling uniformity in accordance with another illustrative embodiment of the present invention.

Turning now to FIG. 4, a simplified flow diagram of a method for controlling uniformity in accordance with another illustrative embodiment of the present invention is provided. In block 400, a characteristic of a workpiece is measured at a plurality of locations. In block 410, a uniformity profile is generated based on the characteristic measurements. In block 420, at least one acceptable region of the workpiece is identified based on the uniformity profile. In block 430, at least one unacceptable region of the workpiece is identified based on the uniformity profile. In block 440, the uniformity profile is filtered to remove at least a portion of the characteristic measurements associated with the second unacceptable region. In block 450, at least one parameter of an operating recipe for performing a process on the workpiece is determined based on the filtered uniformity profile.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

measuring a characteristic of a workpiece at a plurality of locations;

generating a uniformity profile based on the characteristic measurements;

identifying at least one acceptable region of the workpiece based on the uniformity profile;

identifying at least one unacceptable region of the workpiece based on the uniformity profile;

filtering the uniformity profile to remove at least a portion of the characteristic measurements associated with the second unacceptable region; and determining at least one parameter of an operating recipe for performing a process on the workpiece based on the filtered uniformity profile.

2. The method of claim 1, wherein identifying acceptable the first region further comprises identifying acceptable the first region based on the characteristic measurements being within a predefined range.

3. The method of claim 2, wherein identifying unacceptable the second region further comprises identifying unacceptable the second region based on the characteristic measurements being outside the predefined range.

4. The method of claim 1, wherein identifying acceptable the first region further comprises:

determining a performance metric for each of the characteristic measurement; and identifying acceptable the first region based on the performance metrics being within a predefined range.

5. The method of claim 4, wherein identifying unacceptable the second region further comprises identifying unacceptable the second region based on the performance metrics being outside the predefined range.

6. The method of claim 4, wherein determining the performance metric further comprises determining at least one of a yield metric, a reliability metric, and a speed metric.

7. The method of claim 1, wherein the process comprises an etch process, and determining the at least one parameter of the operating recipe further comprises determining a plasma power parameter.

8. The method of claim 1, wherein the process comprises a polishing process, and determining the at least one parameter of the operating recipe further comprises determining a radial polishing pressure parameter.

9. A manufacturing system, comprising:

a metrology tool configured to measure a characteristic of a workpiece at a plurality of locations;

a uniformity monitor configured to generate a uniformity profile based on the characteristic measurements, identify at least one acceptable region of the workpiece based on the uniformity profile, identify at least one unacceptable region of the workpiece based on the uniformity profile, and filter the uniformity profile to remove at least a portion of the characteristic measurements associated with the second unacceptable region; and a process controller configured to determine at least one parameter of an operating recipe for performing a process on the workpiece based on the filtered uniformity profile.

10. The system of claim 9, wherein the uniformity monitor is further configured to identify acceptable the first region based on the characteristic measurements being within a predefined range.

11. The system of claim 10, wherein the uniformity monitor is further configured to identify unacceptable the second region based on the characteristic measurements being outside the predefined range.

12. The system of claim 9, wherein the uniformity monitor is further configured to determine a performance metric for each of the characteristic measurement and identify acceptable the first region based on the performance metrics being within a predefined range.

13. The system of claim 12, wherein the uniformity monitor is further configured to identify unacceptable the second region based on the performance metrics being outside the predefined range.

14. The system of claim 12, wherein the performance metric further comprises at least one of a yield metric, a reliability metric, and a speed metric.

15. The system of claim 9, further comprising an etch tool configured to process the workpiece in accordance with the operating recipe, wherein the at least one parameter of the operating recipe further comprises a plasma power parameter.

16. The system of claim 9, further comprising a polishing tool configured to process the workpiece in accordance with the operating recipe, wherein the at least one parameter of the operating recipe further comprises a radial polishing pressure parameter.

17. A manufacturing system, comprising:

means for measuring a characteristic of a workpiece at a plurality of locations;

means for generating a uniformity profile based on the characteristic measurements;

means for identifying at least one acceptable region of the workpiece based on the uniformity profile;

means for identifying at least one unacceptable region of the workpiece based on the uniformity profile;

means for filtering the uniformity profile to remove at least a portion of the characteristic measurements associated with the second unacceptable region; and means for determining at least one parameter of an operating recipe for performing a process on the workpiece based on the filtered uniformity profile.

* * * * *